US010622244B2

United States Patent
Zenou et al.

(10) Patent No.: US 10,622,244 B2
(45) Date of Patent: Apr. 14, 2020

(54) PULSED-MODE DIRECT-WRITE LASER METALLIZATION

(71) Applicant: ORBOTECH LTD., Yavne (IL)

(72) Inventors: Michael Zenou, Hashmonaim (IL); Zvi Kotler, Tel Aviv (IL); Jonathan Ankri, Ramle (IL); Abraham Rotnemer, Jerusalem (IL); Oleg Ermak, Netanya (IL)

(73) Assignee: ORBOTECH LTD., Yavne (IL)

( * ) Notice: Subject to any disclaimer, the term of this patent is extended or adjusted under 35 U.S.C. 154(b) by 494 days.

(21) Appl. No.: 15/124,036

(22) PCT Filed: Apr. 5, 2015

(86) PCT No.: PCT/IB2015/052476
§ 371 (c)(1),
(2) Date: Sep. 7, 2016

(87) PCT Pub. No.: WO2015/155662
PCT Pub. Date: Oct. 15, 2015

(65) Prior Publication Data
US 2017/0178946 A1 Jun. 22, 2017

Related U.S. Application Data

(63) Continuation-in-part of application No. PCT/IL2014/000014, filed on Feb. 28, 2014.
(Continued)

(51) Int. Cl.
*H01L 21/70* (2006.01)
*H05K 3/02* (2006.01)
(Continued)

(52) U.S. Cl.
CPC ........ *H01L 21/705* (2013.01); *H01L 21/4867* (2013.01); *H05K 3/02* (2013.01);
(Continued)

(58) Field of Classification Search
None
See application file for complete search history.

(56) References Cited

U.S. PATENT DOCUMENTS 3,917,794 A 11/1975 Akagi et al.
4,299,910 A 11/1981 Hung et al.
(Continued)

FOREIGN PATENT DOCUMENTS

JP S61290796 12/1986
JP S63209193 8/1988
(Continued)

OTHER PUBLICATIONS

JP Application # 2016-530667 office action dated May 29, 2018.
JP Application # 2015-557563 office action dated Nov. 14, 2017.
(Continued)

*Primary Examiner* — Duy Vu N Deo
*Assistant Examiner* — Bradford M Gates
(74) *Attorney, Agent, or Firm* — Kligler & Associates Patent Attorneys Ltd

(57) ABSTRACT

A method for manufacturing includes coating a substrate (22) with a matrix (28) containing a material to be patterned on the substrate. A pattern is fixed in the matrix by directing a pulsed energy beam to impinge on a locus of the pattern so as to cause adhesion of the material to the substrate along the pattern without fully sintering the material in the pattern. The matrix remaining on the substrate outside the fixed pattern is removed, and after removing the matrix, the material in the pattern is sintered.

38 Claims, 5 Drawing Sheets

Related U.S. Application Data

(60) Provisional application No. 61/977,766, filed on Apr. 10, 2014, provisional application No. 61/765,808, filed on Feb. 18, 2013.

(51) Int. Cl.
  *H01L 21/48* (2006.01)
  *H05K 1/09* (2006.01)
  *H05K 3/10* (2006.01)
  *H01L 23/15* (2006.01)

(52) U.S. Cl.
  CPC ............. *H01L 23/15* (2013.01); *H05K 1/097* (2013.01); *H05K 3/105* (2013.01); *H05K 2203/107* (2013.01); *H05K 2203/1492* (2013.01)

(56) References Cited

U.S. PATENT DOCUMENTS

| | | |
|---|---|---|
| 4,496,607 A | 1/1985 | Mathias |
| 4,508,753 A | 4/1985 | Stepan |
| 4,931,323 A | 6/1990 | Manitt et al. |
| 5,541,145 A | 7/1996 | Harris et al. |
| 5,745,834 A | 4/1998 | Bampton et al. |
| 5,932,055 A | 8/1999 | Newell et al. |
| 6,159,832 A | 12/2000 | Mayer |
| 6,315,927 B1 | 11/2001 | Kuboto et al. |
| 6,348,295 B1 | 2/2002 | Griffith et al. |
| 6,348,737 B1 | 2/2002 | Advocate, Jr. et al. |
| 6,660,457 B1 | 12/2003 | Imai et al. |
| 6,676,892 B2 | 1/2004 | Das et al. |
| 6,723,278 B1 | 4/2004 | Lu et al. |
| 6,921,626 B2 | 7/2005 | Ray et al. |
| 7,276,385 B1 | 10/2007 | MacKenzie |
| 7,294,449 B1 | 11/2007 | Gudeman et al. |
| 7,615,581 B2 | 11/2009 | Choi et al. |
| 7,630,424 B2 | 12/2009 | Ershov et al. |
| 7,750,076 B2 | 7/2010 | Laude |
| 7,928,322 B2 | 4/2011 | Oki et al. |
| 8,021,821 B2 | 9/2011 | Nagai et al. |
| 8,101,337 B2 | 1/2012 | Kim et al. |
| 2002/0039628 A1 | 4/2002 | Ogawa |
| 2002/0094382 A1 | 7/2002 | Imai et al. |
| 2003/0052105 A1* | 3/2003 | Nagano ............. B23K 26/0604 219/121.83 |
| 2003/0075532 A1 | 4/2003 | Salmon et al. |
| 2004/0241585 A1 | 12/2004 | Kato et al. |
| 2005/0208203 A1 | 9/2005 | Church et al. |
| 2005/0230242 A1 | 10/2005 | Leonhardt et al. |
| 2006/0057502 A1 | 3/2006 | Okada et al. |
| 2008/0139075 A1 | 6/2008 | Birrell et al. |
| 2008/0250972 A1 | 10/2008 | Oldenzijl |
| 2008/0286488 A1 | 11/2008 | Li et al. |
| 2009/0011143 A1 | 1/2009 | Yatsunami et al. |
| 2009/0242854 A1 | 10/2009 | Li et al. |
| 2009/0274833 A1 | 11/2009 | Li et al. |
| 2009/0294964 A1 | 12/2009 | Higashi et al. |
| 2009/0298299 A1 | 12/2009 | Cain et al. |
| 2010/0035375 A1 | 2/2010 | Grigoropoulos et al. |
| 2010/0129566 A1 | 5/2010 | Lee et al. |
| 2010/0276405 A1 | 11/2010 | Cho et al. |
| 2010/0304513 A1* | 12/2010 | Nguyen ................ H01L 51/448 438/27 |
| 2011/0003246 A1 | 1/2011 | Kuroki |
| 2011/0043965 A1 | 2/2011 | Yaniv et al. |
| 2012/0015112 A1 | 1/2012 | Yang et al. |
| 2014/0073145 A1 | 3/2014 | Moffatt et al. |
| 2015/0024120 A1 | 1/2015 | Uchida |
| 2015/0382476 A1 | 12/2015 | Zenou et al. |

FOREIGN PATENT DOCUMENTS

| | | |
|---|---|---|
| JP | H11307914 A | 11/1999 |
| JP | 2002075999 A | 3/2002 |
| JP | 2002220551 A | 8/2002 |
| JP | 2003131365 A | 5/2003 |
| WO | 03037049 A1 | 5/2003 |
| WO | 2012008204 A1 | 1/2012 |
| WO | 2012124438 A1 | 9/2012 |

OTHER PUBLICATIONS

TW Application # 103105324 Office Action dated Dec. 19, 2017.
International Application # PCT/IL2014/000014 Search Report dated May 29, 2014.
Marcus et al., "Solid Freeform Fabrication Proceedings", 397 pages, Sep. 1993.
Simchi, A., "Direct laser sintering of metal powders: Mechanism, kinetics and microstructural features", Materials Science and Engineering A, vol. 428, Issue 1-2, pp. 148-158, Apr. 2006.
Tien et al., "Precision laser metallization", Microelectronic Engineering, vol. 56, pp. 273-279, Oct. 24, 2000.
Regenfuss et al., "Principles of Laser Micro Sintering", pp. 740-753, Sep. 14, 2006.
Toray Industries, Inc., "The functioned photodefinable hybrid materials—Raybrid", 36 pages, Jun. 2009.
Intrinsiq Materials Inc., "Copper Inkjet Ink—CI-002", data sheet, 3 pages, year 2013.
Kumpulainen et al., "Low Temperature Nanoparticle Sintering with Continuous Wave and Pulse Lasers", Journal Optics and Laser Technology, vol. 43, Issue 3, pp. 570-576, Apr. 2011.
Theodorakos et al., "Selective Laser Sintering of Ag Nanoparticles Ink for Applications in Flexible Electronics", Applied Surface Science, vol. 336, pp. 157-162, May 1, 2015.
International Application # PCT/IB2015/052476 Search Report dated Aug. 31, 2015.
European Application # 14751180 Search Report dated Apr. 18, 2017.
U.S. Appl. No. 14/766,749 Office Action dated Jun. 27, 2017.
TW office action #104111474 dated Aug. 2, 3018.
CN Application # 201580015581.9 office action dated Jul. 8, 2019.
JP Application # 2016-552929 office action dated Feb. 18, 2019.

* cited by examiner

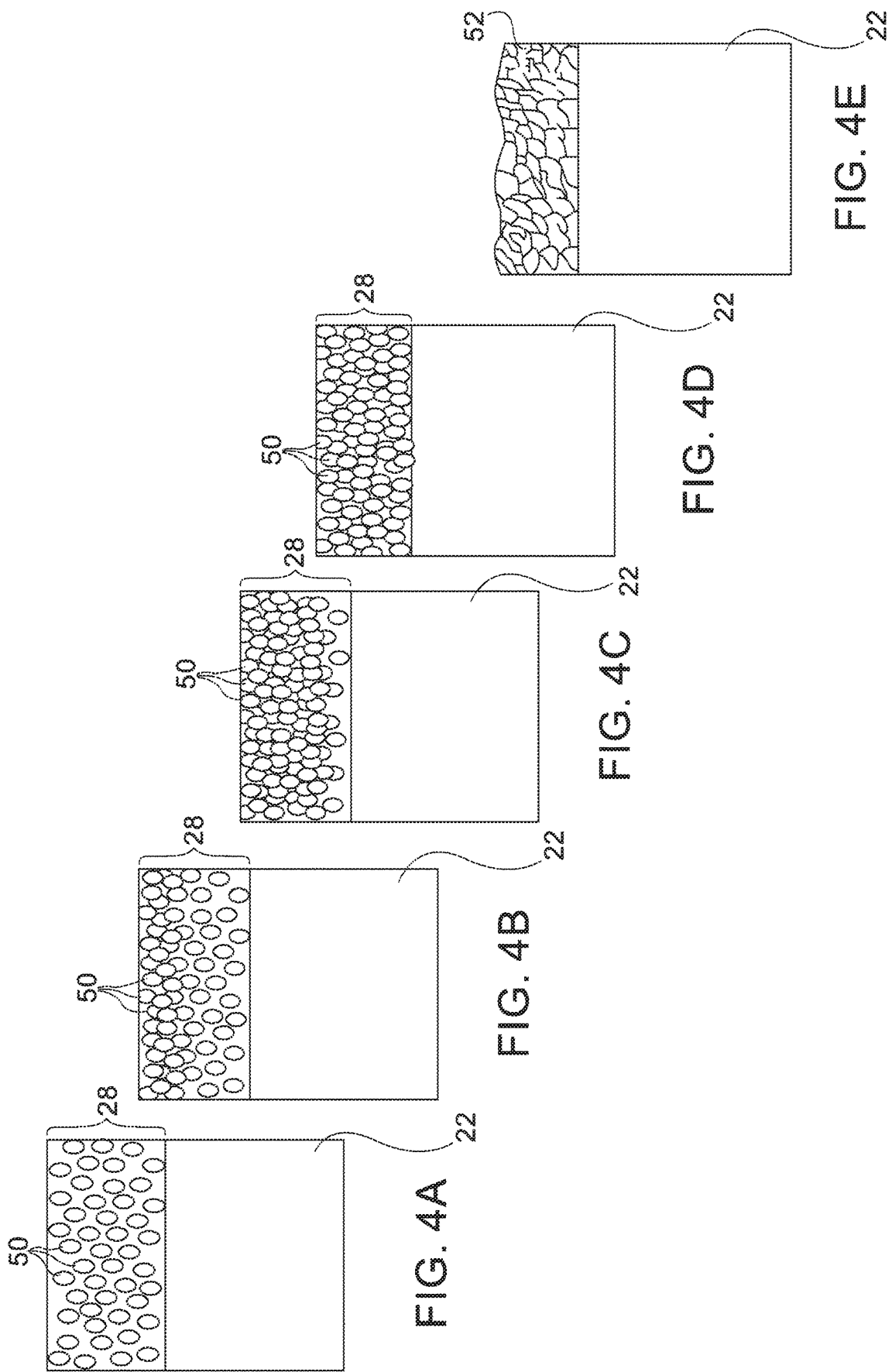

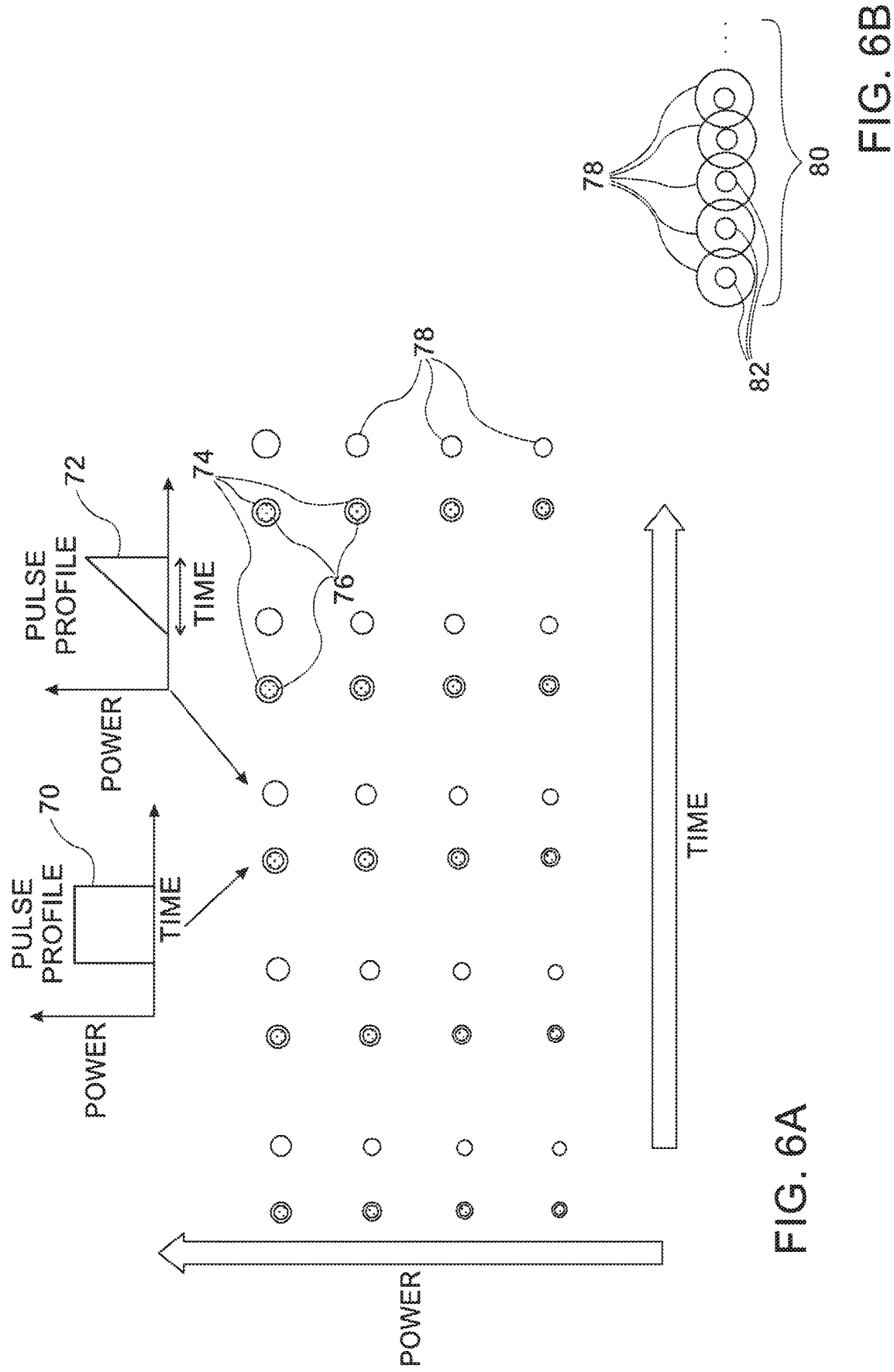

PULSED-MODE DIRECT-WRITE LASER METALLIZATION

CROSS-REFERENCE TO RELATED APPLICATIONS

This application claims the benefit of U.S. Provisional Patent Application 61/977,766, filed Apr. 10, 2014. This application is also a continuation-in-part of PCT Patent Application PCT/IL2014/000014, filed Feb. 28, 2014, claiming the benefit of U.S. Provisional Patent Application 61/765,808, filed Feb. 18, 2013. All of these related applications are incorporated herein by reference.

FIELD OF THE INVENTION

The present invention relates generally to production of printed wiring on circuit substrates, and particularly to methods and systems for direct writing of metal features.

BACKGROUND

Direct laser sintering of metal inks is a known technique for metallization of printed wiring. For example, U.S. Patent Application Publication 2008/0286488 describes a method of forming a conductive film based on depositing a non-conductive film on a surface of a substrate. The film contains a plurality of copper nanoparticles, and exposing at least a portion of the film to light makes the exposed portion conductive by photosintering or fusing the copper nanoparticles.

Kumpulainen et al. describe direct laser sintering techniques in "Low Temperature Nanoparticle Sintering with Continuous Wave and Pulse Lasers," *Optics &Laser Technology* 43 (2011), pages 570-576. The authors relate to "printable electronics," in which nanoparticle inks, printed on the surface of a substrate, contain additives, such as dispersing agents and carrier fluids, that provide good printing properties by changing the viscosity and separating the nanoparticles of the ink. In the sintering process, ink particles are heated to a certain, ink-specific temperature, and the carrier fluid and dispersing agents are evaporated from the ink. Additional heating after evaporation causes the nanoparticles to start to agglomerate. Laser sintering is said to enable short sintering times and selective sintering, making it possible for printed structures to contain fragile active components produced with other technologies. The paper describes tests done with two different types of laser: pulsed and continuous wave.

After the priority date of the present patent application, Theodorakos et al. described further laser sintering techniques in "Selective Laser Sintering of Ag Nanoparticles Ink for Applications in Flexible Electronics," *Applied Surface Science* 336 (2015), pages 157-162. The authors investigate the potential of three different laser sources: continuous wave (CW) or pulsed nanosecond and picosecond lasers, operating at 532 and 1064 nm, as efficient tools for selective laser sintering of Ag nanoparticle ink layers on flexible substrates. Theoretical simulations indicate that picosecond laser pulses restrict the heat-affected zone to a few micrometers only around the irradiated regions of the ink layer. These predictions were confirmed experimentally.

SUMMARY

Embodiments of the present invention provide enhanced methods and systems for laser-based direct writing of traces onto a substrate.

There is therefore provided, in accordance with an embodiment of the invention, a method for manufacturing, which includes coating a substrate with a matrix containing a material to be patterned on the substrate, and fixing a pattern in the matrix by directing a pulsed energy beam to impinge on a locus of the pattern so as to cause adhesion of the material to the substrate along the pattern without fully sintering the material in the pattern. The matrix remaining on the substrate outside the fixed pattern is removed, and after removing the matrix, the material in the pattern is sintered.

In some embodiments, the material to be patterned includes nanoparticles. In a disclosed embodiment, the material in the nanoparticles is electrically conductive, and the pulsed energy beam includes pulses of radiation having an energy fluence and repetition rate selected so that a resistivity of the trace after fixing the pattern remains at least ten times greater than a final resistivity that is to be achieved by full sintering of the material in the pattern after removing the matrix.

Typically, directing the pulsed energy beam includes directing a sequence of pulses of the energy beam to impinge on each location in the locus on the substrate.

In the disclosed embodiments, the pulsed energy beam has a pulse repetition rate of at least 1 MHz, and possibly at least 10 MHz.

Typically, the matrix includes an organic compound in addition to the material to be patterned, and directing the pulsed energy beam includes directing a sequence of pulses of the energy beam with a fluence per pulse selected to as to cause evaporation of the organic compound from the matrix without fully sintering the material in the pattern. The fluence per pulse that is applied in fixing the pattern is selected so that the material remains sufficiently porous to permit the organic compound to evaporate through pores in the material without ablation or delamination of the material due to the evaporation of the organic compound.

In some embodiments, sintering the material includes applying a bulk sintering process to the pattern fixed on the substrate. Alternatively, sintering the material includes directing further pulses of the pulsed energy beam to sinter the pattern fixed on the substrate.

In a disclosed embodiment, coating the substrate includes drying the matrix on the substrate before irradiating the coated substrate. Additionally or alternatively, removing the matrix includes applying a solvent to remove the matrix remaining on the substrate outside the fixed pattern.

There is also provided, in accordance with an embodiment of the invention, a method for manufacturing, which includes coating a substrate with a matrix containing a material to be patterned on the substrate, and directing a pulsed energy beam including pulses having a ramped temporal profile to impinge on a point on the coated substrate with a fluence sufficient to fix the material to the substrate and sinter the material at the point.

In the disclosed embodiments, the matrix includes an organic compound in addition to the material that is to be fixed to the substrate, and the ramped temporal profile and the fluence are selected to as to cause evaporation of the organic compound from the matrix before sintering the material without causing ablation or delamination of the material due to the evaporation of the organic compound. In some embodiments, the material includes nanoparticles, and sintering the material causes fusion of the nanoparticles at the point.

In a disclosed embodiment, the pulses have a duration no greater than 20 ns.

In some embodiments, directing the pulsed energy beam includes creating a pattern of the material on the substrate by directing the pulses to impinge on a sequence of points defining the pattern on the coated substrate. The points in the sequence may be mutually non-overlapping. Typically, the method includes, after creating the pattern, removing the matrix remaining on the substrate outside a locus of the pattern.

There is additionally provided, in accordance with an embodiment of the invention, a system for manufacturing, including a coating machine, which is configured to coat a substrate with a matrix containing a material to be patterned on the substrate. A writing machine is configured to fix a pattern in the matrix by directing a pulsed energy beam to impinge on a locus of the pattern so as to cause adhesion of the material to the substrate along the pattern without fully sintering the material in the pattern. A matrix removal machine is configured to remove the matrix remaining on the substrate outside the fixed pattern. A sintering machine is configured to sinter the material in the pattern after removal of the matrix.

There is further provided, in accordance with an embodiment of the invention, a system for manufacturing, including a coating machine, which is configured to coat a substrate with a matrix containing a material to be patterned on the substrate. A writing machine is configured to direct a pulsed energy beam including pulses having a ramped temporal profile to impinge on a point on the coated substrate with a fluence sufficient to fix the material to the substrate and sinter the material at the point.

The present invention will be more fully understood from the following detailed description of the embodiments thereof, taken together with the drawings in which:

BRIEF DESCRIPTION OF THE DRAWINGS

FIGS. 4A-4D are schematic sectional views of a substrate on which a trace is written, illustrated at successive times during fixation of the trace, in accordance with an embodiment of the invention;

FIG. 4E is a schematic sectional view of the substrate and trace of FIGS. 4A-4D, following annealing of the trace, in accordance with an embodiment of the invention;

FIG. 6A is a schematic top view of a substrate on which spots have been written at an array of points by a pulsed beam with varying pulse parameters, in accordance with an embodiment of the invention; and FIG. 6B is a schematic top view of a pattern formed on a substrate by applying a pulsed beam to a sequence of points, in accordance with an embodiment of the invention.

DETAILED DESCRIPTION OF EMBODIMENTS

Overview

Figure 1:
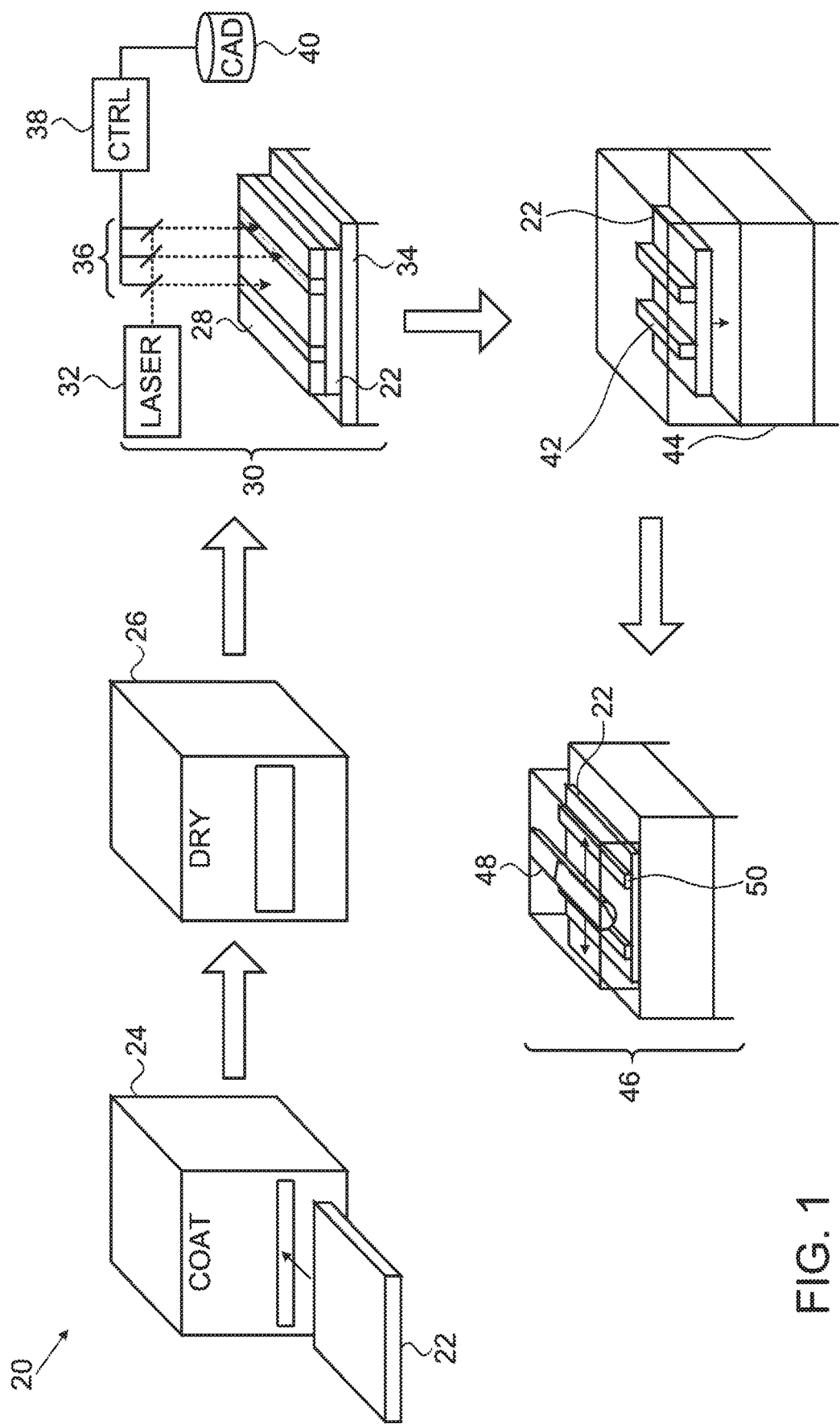
FIG. 1 is schematic, pictorial illustration showing a system for laser-based direct writing and stages in the operation of the system, in accordance with an embodiment of the present invention.

As explained in the above-mentioned PCT Patent Application PCT/IL2014/000014, one-step, direct laser sintering of metal inks and other nanoparticle sinterable inks often does not give sufficiently uniform results. (The term "nanoparticle" is used in the present description and in the claims to mean a microscopic particle having at least one dimension less than 100 nm.) This problem stems, at least in part, from heat conduction that occurs during the local sintering process. Non-uniform heat diffusion under these conditions leads to thermal variations, which in turn cause inconsistent sintering. This effect is most pronounced when dealing with high-resolution patterning of small metallic features, on the order of a few microns. At the same time, direct sintering of metal inks requires high laser fluence, on the order of tens to hundreds of $J/cm^2$, which makes the process slow and inefficient when dealing with large-area patterns.

In some embodiments of the present invention, the steps of writing and sintering are separated in a manner that enhances the uniformity and reliability of the resulting traces. A substrate is coated with a suitable matrix, and may be dried after coating to remove excess solvent. (Such matrices typically comprise an ink, paste or suspension containing nanoparticles, and are referred to herein generically, for the sake of convenience, simply as "NP inks.") A pulsed energy beam source, such as a laser, then scans over the substrate to write the desired pattern without fully sintering the nanoparticles. The term "without fully sintering," as used in the present description and in the claims, means that the nanoparticles in the bulk of the matrix remain substantially separate from one another, such that in the case of metal nanoparticles, the resistivity of the traces at this stage is still at least ten times greater than the final resistivity that is to be achieved after full sintering.

This stage of the process, in which the energy beam writes the pattern, is referred to herein as "fixing" the pattern in the matrix. In some embodiments, the beam scans over the locus of the pattern to be written on the substrate with a sequence (or "burst") of pulses having fluence sufficient to cause adhesion of the material to the substrate along the pattern, but substantially below the threshold for full sintering. This fixation step stabilizes the matrix against subsequent removal, relative to the non-irradiated matrix. The use of pulsed irradiation in this step enhances the quality of the traces of the pattern by reducing the likelihood of damage due to rapid expansion of gases trapped in the matrix.

During this fixation stage, before the nanoparticle material is fully sintered, the material remains sufficiently porous to permit the organic compounds in the matrix to evaporate through pores in the material, thus preventing ablation or delamination of the material that could otherwise be caused by overly rapid evaporation of the organic compound. To ensure this sort of controlled evaporation, the laser (or other energy source) typically directs the sequence of pulses to impinge on each location in the pattern with a high repetition rate—for example, at least 1 MHz, and possibly greater than 10 MHz. The fluence per pulse is selected so that the desired porosity of the matrix is maintained until fixation is complete.

After the pattern has been fixed in this fashion, the matrix is removed from all non-fixed areas, so that only the stabilized pattern remains. Such removal may be accomplished, for example, by application of chemical solvents or by radiative ablation. Typically, the substrate is then heated uniformly in a bulk sintering process in order to sinter the nanoparticles in the remaining pattern. This approach achieves uniform metallization, in contrast to the inhomogeneity that is commonly encountered when direct laser sintering is used. It is also particularly useful in printing thick lines, as the laser fixation step is less sensitive to thickness than full laser sintering, while bulk sintering, in an oven, for example, works well on thick ink traces.

These embodiments thus provide a simple, fast metallization process, with fewer steps than conventional methods. The first step of the process involves only relatively low laser power. Subsequently, the actual metallization step—the bulk sintering process—which requires a high fluence, can be carried out using a high-power source with large area coverage, such as a thermal source or light strip illumination by a high-power flash lamp or a high-power laser or laser array. Because these embodiments avoid the high local temperatures that are associated with one-step direct laser sintering, they are appropriate for use in patterning of delicate, flexible substrates, such as plastics and foils.

In other embodiments, a pulsed laser or other energy beam is used for sintering, as well as fixation. In this case, the inventors have found that pulses having a ramped temporal profile achieve substantially better results than conventional pulses, whose intensity over time is roughly uniform (such as square wave pulses). The ramped temporal profile is advantageous in that it causes evaporation of organic compounds from the matrix that is coated on the substrate before sintering, and thus fusing, the nanoparticle material. The temporal profile and the fluence of the pulses are selected so as to enhance this effect and thus avoid ablation or delamination of the patterned material due to the evaporation of the organic compounds. These single-step embodiments are suitable particularly (although not exclusively) for creating individual sintered spots on a substrate or patterns built up from such spots.

The use of a pulsed laser for direct writing in embodiments of the present invention (for either fixation or direct sintering) achieves high resolution, with the possibility of adaptive registration, as in digital imaging techniques. The metal lines and other features that are created by the disclosed techniques can reach widths as small as a few microns. The resolution is limited only by the laser spot size, which can general be focused to the range of 1-2 µm, or even less. The resolution and the quality of line definition can be improved by tuning the parameters of the laser during the scan. Arbitrary patterns can be drawn in this manner, possibly working directly from computer-aided design and manufacturing (CAD/CAM) data.

In some embodiments, the entire cycle of writing and sintering is carried out without contacting the substrate. This feature is beneficial particularly for applications such as production of photovoltaic cells and plastic electronics foils.

Other potential applications of the techniques described herein include, for example, display back-end metallization for liquid crystal and organic light-emitting diode (OLED) displays, touch screen metallization, shunting lines for OLED lighting devices, and printed electronic circuits and devices on plastic foils. The techniques described herein may similarly be applied, mutatis mutandis, in writing patterns with a variety of NP materials—comprising not only metals, but also semiconductor and dielectric particles (such as ceramic particles)—on various dielectric, ceramic, semiconductor, polymeric, paper and metal substrates.

Although the embodiments disclosed herein refer specifically, for the sake of simplicity, to formation of a single metallization layer, in alternative embodiments traces may be written in multiple layers by appropriate repetition of the present techniques, with the same or different inks used in each layer.

System Description

Reference is now made to FIGS. 1 and 2A-2E, which schematically illustrate a system 20 and process of laser-based direct writing, in accordance with an embodiment of the present invention. FIG. 1 is a pictorial illustration showing component apparatus and stages in a process carried out by system 20. FIGS. 2A-2E are schematic top views of a substrate 22 on which a pattern of traces is written in system 20, illustrated in successive stages of the process. As noted earlier, substrate 22 may comprise, for example, glass or other dielectric, ceramic, semiconductor, plastic foil or other polymeric material, paper or metal.

Initially, a coating machine 24 coats substrate 22 (FIG. 2A) with a uniformly-thick layer of a matrix 28 (FIG. 2B), such as metal nanoparticle (NP) ink, metal NP paste, or metal complex ink or paste. Such an ink or paste may contain, for example, silver, copper, nickel, palladium, and/or gold nanoparticles, as well as alloys of such metals, or possibly non-metallic nanoparticles, such as silicon or nano-ceramic particles. The layer thickness of matrix 28 can vary, depending on the final outcome required, from about 0.2 µm to more than 10 µm. Coating machine 24 may apply any suitable area coating technique that is known in the art, such as screen printing, slot-die or bar coating, spray coating, gravure, or spin coating.

Optionally, a drying machine 26 dries the matrix that has been applied to substrate 22. The ink or paste applied by coating machine 24 typically contains a large amount of a solvent, while the metal volumetric content at this stage is no more than about 40%. It may therefore be advantageous—although not mandatory—to dry out the matrix before the laser scanning step in order to enhance the stability of the matrix and reduce loss of laser energy to the solvent. Possible drying methods include low-temperature baking (by convection or by radiation), air flow, vacuum drying, or combinations of these techniques.

Figure 2A:
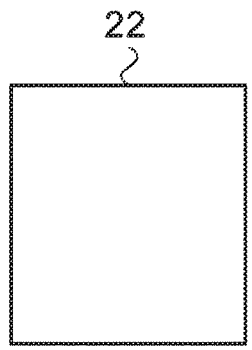
FIGS. 2A-2E are schematic top views of a substrate on which a pattern of traces is written, illustrated in successive stages of a process of forming the pattern, in accordance with an embodiment of the present invention.
Figure 2B:
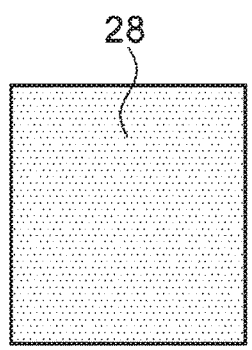
Figure 2C:
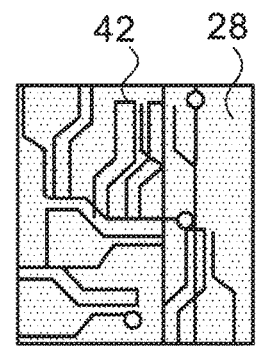

A laser writing machine 30 fixes a pattern of traces 42 in matrix 28, as illustrated in FIG. 2C. In a typical implementation, substrate 22 with matrix 28 coated thereon is mounted on a suitable table 34, and a beam scanner 36 scans the beam of a pulsed laser 32 (or other suitable pulsed energy source) over the substrate.

Laser 32 "writes" the desired pattern in the matrix by exposing the matrix to a well-defined sequence of laser pulses at predetermined positions on the film. The pattern is determined by a controller 38, typically on the basis of suitable CAD/CAM data stored in a memory 40. The pulse parameters, including wavelength, spot size, fluence, duration, pulse shape, scan speed, and repetition rate, are selected so as to optimize the quality of the pattern, as described further hereinbelow. For high throughput, multiple laser beams (generated by multiple lasers or by splitting a single high-power pulsed laser beam into sub-beams, as illustrated in FIG. 1) may be scanned simultaneously over different areas of the substrate, with each beam controlled independently.

Various sorts of lasers and laser systems may be used in laser writing machine 30. In some embodiments, a laser diode source is directly modulated at a high rate to emit pulses of the desired shape, on a time scale that goes from one to several tens of nanoseconds. In some of these embodiments, the pulse shape is ramped (as described further hereinbelow), with a ramping time that is tuned to fit the trace thickness. The pulse parameters may also be tuned according to the trace width, with shorter pulses used when very narrow lines are needed. The choice of pulse parameters also depends on whether machine 30 is used only for fixation, to be followed by bulk sintering, or whether laser 32 is used to fully sinter the traces.

Alternatively, a CW laser source, such as a CW fiber laser, can be modulated at the required high repetition rate to provide the desired pulsed beam. A fast external modulator, such as an electro-optic or acousto-optic modulator, may be used for this purpose.

Figure 3A:
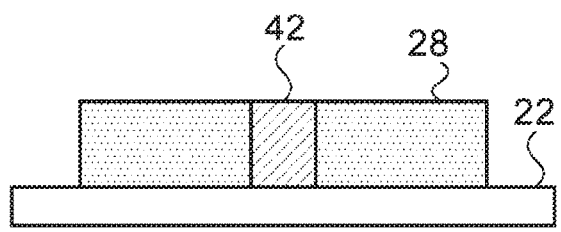
FIGS. 3A and 3B are schematic sectional views of a substrate on which a trace is written, illustrated in successive stages of a process of forming the trace, in accordance with an embodiment of the present invention.

FIG. 3A is a schematic sectional view, showing one of traces 42 fixed in matrix 28 by writing machine 30, in accordance with an embodiment of the present invention. Trace 42 typically does not contain a substantial amount of sintered metal at this stage, but is rather in a state of matter that is, due to laser exposure (as the result of a photonic or thermal effect), more adherent to and stable against removal from substrate 22 than the surrounding matrix 28. As noted above, the laser parameters of writing machine 30 are chosen so as to provide the required local change in the matrix properties. The optimal parameters will vary depending on the precise matrix materials and dimensions and the method of writing that is chosen, and will be determined in each case by empirical testing and evaluation. In any case, the power applied at this stage is much less than that required for full sintering of the nanoparticles in the matrix.

Figure 2D:
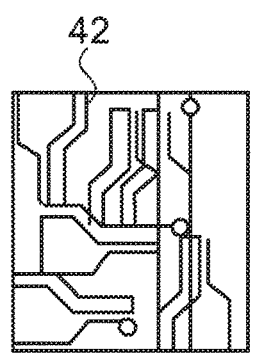

After irradiation, a matrix removal machine 44 removes the unfixed matrix 28 from the full area of substrate 22, leaving only traces 42 (FIG. 2D). Machine 44 may comprise a solvent bath, for example, in which the substrate is immersed to wash away the matrix outside the pattern. Alternatively or additionally, machine 44 may apply other sorts of removal techniques, such as chemical or physical ablation of the unfixed matrix.

Figure 3B:
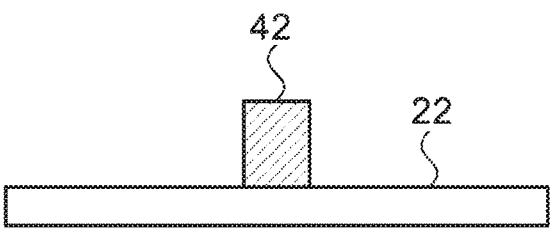

FIG. 3B is a schematic sectional view of trace 42 remaining on substrate 22 following removal of matrix 28 by machine 44.

Figure 2E:
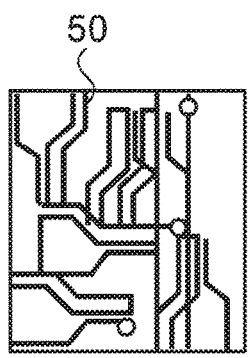

Finally, the traces 42 remaining on substrate 22 after matrix removal are sintered in a sintering machine 46, giving sintered traces 50 as shown in FIG. 2E. Sintering machine 46 may comprise a conventional sintering oven, if substrate 22 is suitable for such treatment (as is generally the case with glass substrates, for example). Alternatively, sintering machine 46 may use photonic sintering, which is generally better suited for sensitive substrates, such as plastic foils. Further alternatively, other sintering methods may be appropriate for sensitive substrates, for example plasma sintering or microwave sintering, both of which can sinter a metallic ink pattern without damaging an underlying plastic substrate.

In general, photonic sintering (or microwave or plasma sintering) is preferred over oven sintering when dealing with copper inks in ambient atmosphere, due to the tendency of copper to oxidize easily, as well as with inks containing other metals that are prone to oxidation. Oven sintering of copper inks can be used, as well, in an appropriate atmosphere (i.e., a non-oxidizing atmosphere and/or a reducing atmosphere).

Sintering machine 46 as shown in FIG. 1 uses photonic sintering, with a high-intensity optical source 48 that scans over the surface of substrate 22. Source 48 may comprise, for example, a collection of laser diode bars arranged in a row or in a stack, thus providing the required fluence even over a large area. An average power on the order of several kilowatts is achievable using commercially-available laser diode bars in the near infrared range (roughly 800-1000 nm), such as those produced by Oclaro Inc. (San Jose, Calif.), Coherent Inc. (Santa Clara, Calif.), or Jenoptik (Jena, Germany).

The next section of this description will describe methods that may be applied by writing machine 30 to fix the desired pattern in matrix 28. In an alternative embodiment, illustrated in FIGS. 6A and 6B, writing machine 30 may perform sintering, as well, by applying sufficient energy to target points on the substrate that define the pattern. In this latter case, the separate sintering machine 46 may not be required. The techniques described herein may be applied in conjunction with the materials and methods described in the above-mentioned PCT Patent Application PCT/IL2014/000014, as well as other suitable materials and methods that are known in the art.

Pulsed Laser Pattern Fixation

Reference is now made to FIGS. 4A-4E, which are schematic sectional views of substrate 22 at successive stages of writing a trace 52 on the substrate, in accordance with an embodiment of the invention. FIGS. 4A-4D show matrix 28 at successive times during fixation of the trace, while FIG. 4E shows trace 52 following annealing.

Specifically, FIGS. 4A-4D show the cumulative effects of a burst of pulses directed by laser 32 onto a given location in matrix 28. At the beginning of the process, nanoparticles 50 are suspended in a substantial volume of a volatile, organic component of matrix 28. Each successive laser pulse heats the matrix and evaporates an additional amount of the organic component, so that the density of nanoparticles 50 in matrix 28 increases from one pulse to the next. Due to diffusion of the heat within the matrix and substrate, however, the increase in density is roughly uniform over the volume of the matrix. Thus, as shown in FIG. 4D, pores remain between nanoparticles 50 in matrix 28, through which evaporating material can escape, even after nearly all of the organic material has been driven out of the matrix. The nanoparticles fuse together to create trace 52, as shown in FIG. 4E, only during the subsequent sintering step.

By contrast, the inventors have found that when a CW laser is used for pattern fixation, the nanoparticle density tends to increase particular in the upper layer of the matrix, leaving organic materials trapped below. Heating of these trapped organic materials can result in rapid, explosive evaporation, leading to ablation or delamination of the surrounding nanoparticle material, thus degrading the quality of the trace that is formed on the substrate.

By contrast, when pulsed radiation is used for fixation, the pulse parameters are chosen in order to promote gradual evaporation of the organic components of matrix 28 over the course of a burst of pulses, while avoiding solidification of the upper layer of nanoparticles 50. The inventors have found short pulses, with pulse width in the range from about 1 ns to a few tens of nanoseconds, to give best results. High repetition rates—at least 1 MHz, and possibly 10 MHz or more—are desirable in order to achieve rapid fixation of the traces and thus high process throughput. The pulse fluence and other parameters are typically chosen in order to maximize throughput insofar as possible without damage to the traces.

Figure 5:
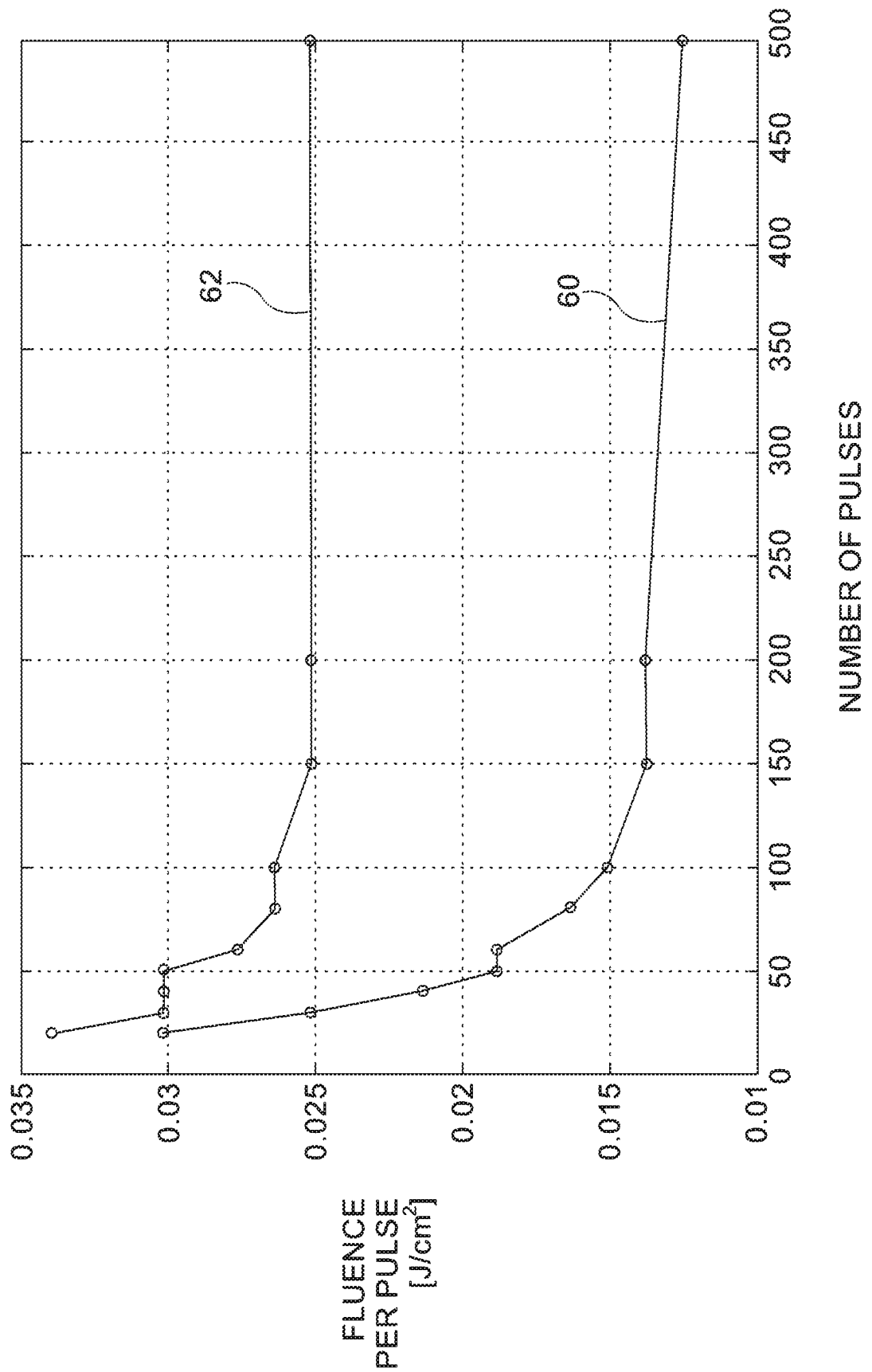
FIG. 5 is a plot illustrating a dependence of pulse energy thresholds for fixation of and damage to a trace written on a substrate, in accordance with an embodiment of the invention.

FIG. 5 is a plot illustrating a working window for trace fixation by laser pulses, in accordance with an embodiment of the invention. Data points in the plot indicate, in the abscissa, the number of pulses applied to a given point on substrate 22, and in the ordinate, the energy fluence per pulse. A lower curve 60 indicates, for any given number of pulses, the minimum fluence required to fix the pattern in the matrix. In other words, as long as the pulses at a given point have at least this minimum fluence over the specified number of pulses, the matrix will not be washed away from the point after the fixation stage. An upper curve 62 indicates, for the given number of pulses, the maximum fluence that can be used without damaging the trace. Above this fluence level, rapid heating of the matrix is liable to cause ablation and/or delamination.

Thus, curves 60 and 62 define the working window for pulsed fixation of matrix 28. As can be seen in FIG. 5, larger number of low-fluence pulses gives a wider window and hence a larger range of process tolerance. Within these bounds, the pulse fluence and number of pulses applied to each location can be chosen to give the desired solidity of fixation while maximizing process throughput. The optimal choice will also depend on other process parameters, such as the thickness and composition of matrix 28, as well as the laser wavelength and spot size. Curves 60 and 62 were generated using a diode laser operating at 980 nm on a matrix film that was 460 nm thick. Alternatively, pulsed lasers in the ultraviolet, visible, or other parts of the infrared range may be used. The number of pulses required to fix the pattern (as reflected by curve 60) tends to scale exponentially with the film thickness.

Pulsed Laser Sintering

FIG. 6A is a schematic top view of a substrate on which spots 74, 78 have been written at an array of points by a pulsed beam with varying pulse parameters, in accordance with an embodiment of the invention. In this embodiment, the substrate was coated with a matrix containing a nanoparticle material. A pulsed laser beam was directed to impinge on the substrate at each point in the array with fluence sufficient both to fix the material to the substrate and to sinter the material at the point. The laser beam in this case, as well, was a diode laser operating at 980 nm in pulsed mode. The peak power of the laser pulses that were applied in creating spots 74 and 78 increased from the bottom to the top of the array shown in FIG. 6A, while the pulse duration increased from left to right, with the maximum pulse duration set to about 20 ns. Similar results are obtained at other wavelengths.

Two different pulse profiles were used in sintering the spots shown in FIG. 6A: A rectangular pulse profile 70 was used in sintering spots 74, while a ramped pulse profile 72 was used in sintering spots 78. Profile 72 is "ramped" in the sense that the instantaneous power of the pulse increases gradually over the pulse duration, with the greatest power occurring near the trailing edge of the pulse. The ramped temporal profile and the fluence of the ramped pulses are selected so as to cause evaporation of the organic compound from the matrix before sintering the nanoparticle material, without causing ablation or delamination of the material due to explosive evaporation of the organic compound. This advantageous effect of the ramped profile can be seen over a wide range of peak powers and pulse durations, as illustrated by spots 78. By contrast, spots 74, created using profile 70, exhibit areas 76 of damage due to ablation and delamination of the nanoparticle material.

Ramped profile 72 is useful particularly in creating single sintered spots on a substrate. These spots will typically have a larger diameter than the laser beam itself due to transverse thermal spreading of the beam energy over the nearby area of the matrix. (The ramped beam profile is generally less critical in line scanning, since each point in the line, other than the initial point, is preheated as the preceding point is sintered.) Single spots of this sort can be used to create a pattern on the substrate by directing the laser pulses to impinge on a sequence of points defining the pattern on the coated substrate. The points in this sequence can be mutually non-overlapping, i.e., the beam areas of the laser pulses that are used to create the neighboring spots need not themselves overlap, since each spot has a larger area than the laser beam used in fixing and sintering it. After creating the pattern in this manner, the matrix remaining on the substrate outside the locus of the pattern is removed, as in the preceding embodiments.

FIG. 6B is a schematic top view of a pattern 80 formed on a substrate by applying a pulsed beam to a sequence of points 82, in accordance with an embodiment of the invention. In this example, pattern 80 comprises a line formed by the overlap of spots 78, although points 82 do not themselves overlap. Patterns of substantially any desired form may be created efficiently in this manner.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for manufacturing, comprising:
    coating a substrate with a matrix containing a material to be patterned on the substrate;
    fixing a pattern in the matrix by directing a pulsed energy beam to impinge on a locus of the pattern so as to cause adhesion of the material to the substrate along the pattern without fully sintering the material in the pattern;
    removing the matrix remaining on the substrate outside the fixed pattern; and
    after removing the matrix, sintering the material in the pattern.

2. The method according to claim 1, wherein the material to be patterned comprises nanoparticles.

3. The method according to claim 2, wherein the material in the nanoparticles is electrically conductive, and wherein the pulsed energy beam comprises pulses of radiation having an energy fluence and repetition rate selected so that a resistivity of the trace after fixing the pattern remains at least ten times greater than a final resistivity that is to be achieved by full sintering of the material in the pattern after removing the matrix.

4. The method according to claim 1, wherein directing the pulsed energy beam comprises directing a sequence of pulses of the energy beam to impinge on each location in the locus on the substrate.

5. The method according to claim 1, wherein the pulsed energy beam has a pulse repetition rate of at least 1 MHz.

6. The method according to claim 5, wherein the pulse repetition rate is at least 10 MHz.

7. The method according to claim 1, wherein the matrix comprises an organic compound in addition to the material to be patterned, and wherein directing the pulsed energy beam comprises directing a sequence of pulses of the energy beam with a fluence per pulse selected to as to cause evaporation of the organic compound from the matrix without fully sintering the material in the pattern.

8. The method according to claim 7, wherein the fluence per pulse that is applied in fixing the pattern is selected so that the material remains sufficiently porous to permit the organic compound to evaporate through pores in the material without ablation or delamination of the material due to the evaporation of the organic compound.

9. The method according to claim 1, wherein sintering the material comprises applying a bulk sintering process to the pattern fixed on the substrate.

10. The method according to claim 1, wherein sintering the material comprises directing further pulses of the pulsed energy beam to sinter the pattern fixed on the substrate.

11. The method according to claim 1, wherein coating the substrate comprises drying the matrix on the substrate before irradiating the coated substrate.

12. The method according to claim 1, wherein removing the matrix comprises applying a solvent to remove the matrix remaining on the substrate outside the fixed pattern.

13. A method for manufacturing, comprising:
coating a substrate with a matrix containing a material to be patterned on the substrate; and
directing a pulsed energy beam comprising pulses having a ramped temporal profile, in which an instantaneous power of each pulse increases gradually over a duration of the pulse, to impinge on a point on the coated substrate with a fluence sufficient to fix the material to the substrate and sinter the material at the point.

14. The method according to claim 13, wherein the matrix comprises an organic compound in addition to the material that is to be fixed to the substrate, and wherein the ramped temporal profile and the fluence are selected to as to cause evaporation of the organic compound from the matrix before sintering the material without causing ablation or delamination of the material due to the evaporation of the organic compound.

15. The method according to claim 13, wherein the material comprises nanoparticles, and wherein sintering the material causes fusion of the nanoparticles at the point.

16. The method according to claim 13, wherein the pulses have a duration no greater than 20 ns.

17. The method according to claim 13, wherein directing the pulsed energy beam comprises creating a pattern of the material on the substrate by directing the pulses to impinge on a sequence of points defining the pattern on the coated substrate.

18. The method according to claim 17, wherein the points in the sequence are mutually non-overlapping.

19. The method according to claim 17, and comprising, after creating the pattern, removing the matrix remaining on the substrate outside a locus of the pattern.

20. A system for manufacturing, comprising:
a coating machine, which is configured to coat a substrate with a matrix containing a material to be patterned on the substrate;
a writing machine, which is configured to fix a pattern in the matrix by directing a pulsed energy beam to impinge on a locus of the pattern so as to cause adhesion of the material to the substrate along the pattern without fully sintering the material in the pattern;
a matrix removal machine, which is configured to remove the matrix remaining on the substrate outside the fixed pattern; and
a sintering machine, which is configured to sinter the material in the pattern after removal of the matrix.

21. The system according to claim 20, wherein the material to be patterned comprises nanoparticles.

22. The system according to claim 21, wherein the material in the nanoparticles is electrically conductive, and wherein the pulsed energy beam comprises pulses of radiation having an energy fluence and repetition rate selected so that a resistivity of the trace after fixing the pattern remains at least ten times greater than a final resistivity that is to be achieved by full sintering of the material in the pattern after removing the matrix.

23. The system according to claim 20, wherein the writing machine is configured to direct a sequence of pulses of the energy beam to impinge on each location in the locus on the substrate.

24. The system according to claim 20, wherein the pulsed energy beam has a pulse repetition rate of at least 1 MHz.

25. The system according to claim 24, wherein the pulse repetition rate is at least 10 MHz.

26. The system according to claim 20, wherein the matrix comprises an organic compound in addition to the material to be patterned, and wherein the writing machine is configured to direct a sequence of pulses of the energy beam with a fluence per pulse selected to as to cause evaporation of the organic compound from the matrix without fully sintering the material in the pattern.

27. The system according to claim 26, wherein the fluence per pulse that is applied in fixing the pattern is selected so that the material remains sufficiently porous to permit the organic compound to evaporate through pores in the material without ablation or delamination of the material due to the evaporation of the organic compound.

28. The method according to claim 20, wherein the sintering machine is configured to apply a bulk sintering process to the pattern fixed on the substrate.

29. The method according to claim 20, wherein the sintering machine is configured to apply further pulses of the pulsed energy beam to sinter the pattern fixed on the substrate.

30. The method according to claim 20, and comprising a drying machine, which is configured to dry the matrix on the substrate before irradiating the coated substrate.

31. The method according to claim 20, wherein the matrix removal machine is configured to apply a solvent to remove the matrix remaining on the substrate outside the fixed pattern.

32. A system for manufacturing, comprising:
a coating machine, which is configured to coat a substrate with a matrix containing a material to be patterned on the substrate; and
a writing machine, which is configured to direct a pulsed energy beam comprising pulses having a ramped temporal profile, in which an instantaneous power of each pulse increases gradually over a duration of the pulse, to impinge on a point on the coated substrate with a fluence sufficient to fix the material to the substrate and sinter the material at the point.

33. The system according to claim 32, wherein the matrix comprises an organic compound in addition to the material that is to be fixed to the substrate, and wherein the ramped temporal profile and the fluence are selected to as to cause evaporation of the organic compound from the matrix before sintering the material without causing ablation or delamination of the material due to the evaporation of the organic compound.

34. The system according to claim 32, wherein the material comprises nanoparticles, and wherein sintering the material causes fusion of the nanoparticles at the point.

35. The system according to claim 32, wherein the pulses have a duration no greater than 20 ns.

36. The method according to claim 32, wherein the writing machine is configured to create a pattern of the material on the substrate by directing the pulses to impinge on a sequence of points defining the pattern on the coated substrate.

37. The system according to claim 36, wherein the points in the sequence are mutually non-overlapping.

38. The system according to claim 36, and comprising a matrix removal machine, which is configured to remove the matrix remaining on the substrate outside a locus of the pattern.

* * * * *